United States Patent
Li et al.

(10) Patent No.: US 7,521,317 B2
(45) Date of Patent: Apr. 21, 2009

(54) METHOD OF FORMING A SEMICONDUCTOR DEVICE AND STRUCTURE THEREOF

(75) Inventors: Chi Nan Brian Li, Austin, TX (US); Ko-Min Chang, Austin, TX (US); Cheong M. Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 249 days.

(21) Appl. No.: 11/376,412

(22) Filed: Mar. 15, 2006

(65) Prior Publication Data

US 2007/0218669 A1   Sep. 20, 2007

(51) Int. Cl.
*H01L 21/336* (2006.01)
(52) U.S. Cl. ................ 438/257; 438/258; 257/E21.423
(58) Field of Classification Search ................ 438/257, 438/258, 288, 295, 287; 257/E21.423, E21.309, 257/E21.21, E21.431
See application file for complete search history.

(56) References Cited

U.S. PATENT DOCUMENTS

| | | | |
|---|---|---|---|
| 6,939,767 B2 | 9/2005 | Hoefler et al. | |
| 7,064,030 B2 * | 6/2006 | Chindalore et al. | 438/257 |
| 2003/0123307 A1 | 7/2003 | Lee et al. | |
| 2005/0062098 A1 | 3/2005 | Mahajani et al. | |
| 2006/0046403 A1 * | 3/2006 | Chu et al. | 438/288 |
| 2007/0212832 A1 * | 9/2007 | Orlowski | 438/257 |

OTHER PUBLICATIONS

Kuniyoski Yoshikawa, Embedded Flash Memories, 1999 International Symposium on VLS/Technology, Jun. 8-10, 1999.
Craig Swift, et al., Planar SONOS (TFS) Flash Bitcell Structure, U.S. Appl. No. 11/341,809, filed Jan. 27, 2006.
International Search Report and Written Opinion related to PCT/US07/62535, Applicant's file reference MT10014TP, dated Feb. 28, 2008.

* cited by examiner

*Primary Examiner*—Walter L Lindsay, Jr.
(74) *Attorney, Agent, or Firm*—Kim-Marie Vo

(57) ABSTRACT

A method for forming a semiconductor device includes providing a semiconductor substrate comprising silicon, forming a layer of dielectric on the surface of the semiconductor substrate, forming a gate electrode comprising silicon over the layer of dielectric, recessing the layer of dielectric under the gate electrode, filling the recess with a discrete charge storage material, oxidizing a portion of the gate electrode, and oxidizing a portion of the semiconductor substrate.

20 Claims, 5 Drawing Sheets

METHOD OF FORMING A SEMICONDUCTOR DEVICE AND STRUCTURE THEREOF

FIELD OF THE INVENTION

This invention relates generally to semiconductor devices, and more specifically, to non-volatile storage devices.

BACKGROUND

Electrically erasable programmable read only memory (EEPROM) structures are commonly used in integrated circuits for non-volatile data storage. As semiconductor devices continue to evolve, the operating voltages of such semiconductor devices are often reduced in order to suit low power applications. It is desirable for such operating voltage reductions to be accomplished while ensuring that the speed and functionality of the devices is maintained or improved. One EEPROM device, which operates at lower operating voltages than a continuous floating gate device, uses a silicon-oxide-nitride-oxide-silicon (SONOS) structure, in which charge is stored in the nitride layer. In the SONOS structure charges can be stored on either end or both ends of the SONOS structure. This allows for the SONOS structure to store 4 states (00, 01, 10, and 11). Thus, two bits can be stored.

The SONOS structure uses a nitride layer with a high trap density to store charge. This high trap density causes electrons to hop from one state to another according to the Frenkel-Poole mechanism. As the channel region of SONOS structures decreases, the two states can not be differentiated from each other due to the Frenkel-Poole mechanism. This decreases the capability of multibit storage. Therefore, a need exists to enable multibit storage in SONOS structure as channel lengths decrease.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
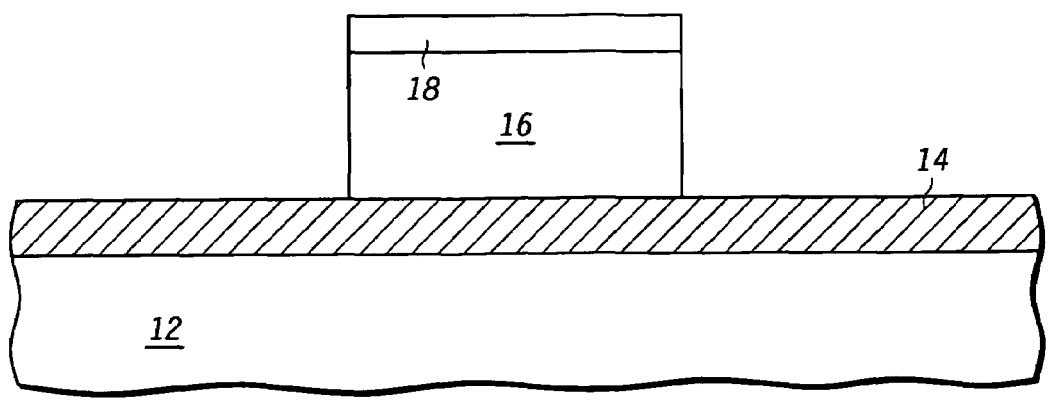
FIG. 1 illustrates a cross-sectional view of a portion of a semiconductor device after forming a dielectric layer, a gate electrode, and an anti-reflective coating over the semiconductor substrate in accordance with an embodiment of the present invention.

FIG. 1 illustrates a cross-sectional view of the semiconductor device 10 having a semiconductor substrate 12, a dielectric layer 14, a gate electrode 16, and an anti-reflective coating (ARC) layer 18. As a skilled artisan should recognize the ARC layer 18 was used to etch a gate electrode layer resulting in the gate electrode 16 being formed. The semiconductor substrate 12 can be any semiconductor material or combinations of materials, such as silicon germanium, silicon-on-insulator (SOI) (e.g., fully depleted SOI (FDSOI)), silicon, monocrystalline silicon, the like, and combinations of the above. As will be better understood after further discussion, the semiconductor substrate 12 is a material that can be oxidized. The dielectric layer 14 is formed on the surface of the semiconductor substrate 12, in one embodiment. The dielectric layer 14 can be any insulating layer, such as silicon dioxide, an oxynitride (which preferably is an oxygen-rich oxynitride) or a nitride, provided it is not the same material as the subsequently formed discrete charge storage material. For example, if the dielectric layer 14 and subsequently formed discrete charge storage material are both nitrides, the dielectric layer 14 may be a higher quality nitride than the discrete charge storage material. In another embodiment, the dielectric layer 14 and the subsequently formed discrete charge storage materials are both nitrides, but the nitrides are formed by changing processing parameters such as changing temperature and using a different ratio of chemical species. The dielectric layer 14 should have less trapping sites than the subsequently formed discrete charge storage material, because, as will be better understood after further discussion, a portion of the dielectric layer 14 will prevent or minimize the Frenkel-Poole mechanism from occurring in the subsequently formed discrete charge storage material. Any conventional processing can be used to form the dielectric layer 14, such as chemical vapor deposition (CVD), atomic layer deposition (ALD), or thermal growth. In one embodiment, the dielectric layer 14 is approximately 30 to 500 Angstroms thick.

Formed over the dielectric layer, the gate electrode 16 can be any suitable material that can be oxidized, such as polysilicon. The ARC layer 18 can be any suitable material, such as silicon rich silicon nitride. Any conventional processing can be used to form the gate electrode 16 and the ARC layer 18, such as chemical vapor deposition (CVD) or atomic layer deposition (ALD).

Figure 2:
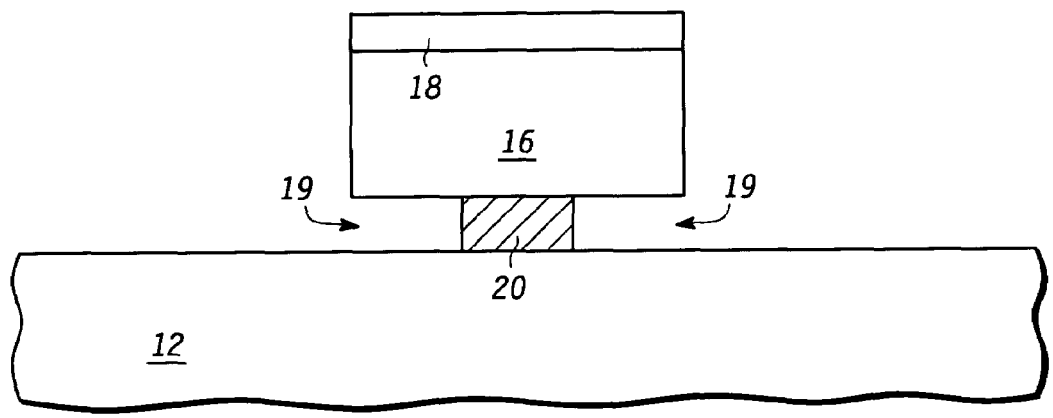
FIG. 2 illustrates the semiconductor device of FIG. 1. after recessing the dielectric layer in accordance with an embodiment of the present invention.

After forming the structure of FIG. 1, the dielectric layer 14 is recessed with respect to the gate electrode 16 to create an isolation region 20 between gaps or recesses 19, as shown in FIG. 2. In one embodiment, the dielectric layer 14 is recessed by performing an undercut etch. If the dielectric layer 14 is silicon dioxide, a wet etch of HF may be used. Alternatively, a dry isotropic etch may be used. The undercut etch may be controlled to control the width of the resulting isolation region 20. One way to control the etch involved changing the HF bath each time the wet etch or group of wet etches are performed. In one embodiment, the each gap 19 is between approximately 0.01 to 0.2 microns, or more preferably between approximately 0.01 to 0.05 microns in width.

After forming the isolation region 20, the discrete charge storage material 22 is formed over the semiconductor device 10 including being formed within the gaps 19. In the embodiment illustrated in FIG. 3, the gaps 19 are shown as completely filled, however, the gaps 19 may not be entirely filled with the discrete charge storage material 22 but should at least be substantially filled (i.e., at least 50%) with the discrete charge storage material 22. Thus, the discrete charge storage material 22 at least partially fills the gaps 19. If the gaps 19 are not completed filled with the discrete charge storage material, the rest of the gaps 19 may be filled with other materials, as will be explained in regards to FIGS. 9-12. Alternatively, if the discrete charge storage material 22 does not fill the gaps 19, the gaps 19 may be filled with air, which can help reduce the Frenkel-Poole mechanism by helping isolate the subsequently formed discrete charge storage regions (which are created from the charge storage material 22) along with the isolation region 20.

Figure 3:
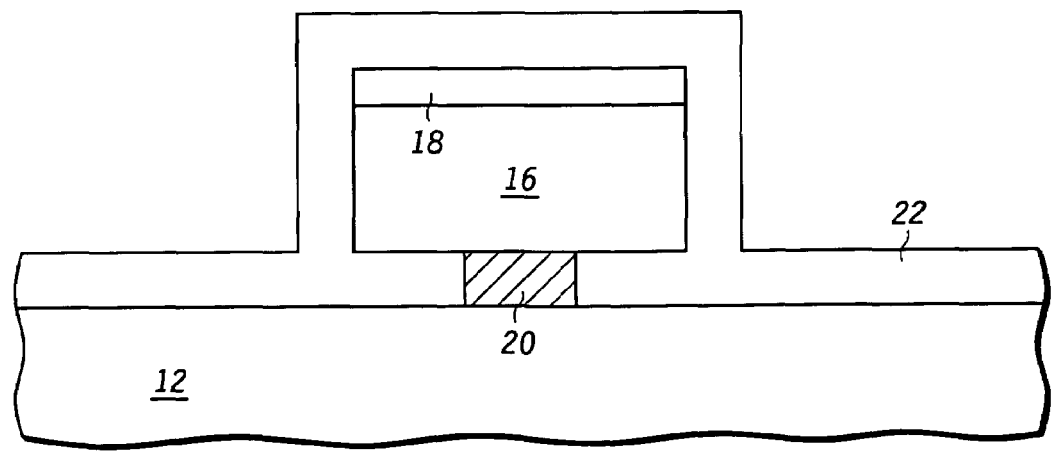
FIG. 3 illustrates the semiconductor device of FIG. 2 after forming a nitride layer in accordance with an embodiment of the present invention.

As shown in FIG. 3, the discrete charge storage material 22 is a continuous layer, such as a nitride layer formed by CVD (e.g., low pressure CVD (LPCVD)). LPCVD nitride is preferred because it has many traps. As discussed above in regards to the dielectric layer 14, of which a portion becomes the isolation region 20, the material used for the discrete charge storage material should have a higher trap density that the material used for the isolation region 20. In other embodiments, the discrete charge storage material may be either a single or plurality of spherical shapes, such as nanoclusters (or nanocrystals) or alloys including a metal and silicon (e.g., tungsten silicide) materials. Any known method can be used to form the discrete charge storage materials.

Figure 4:
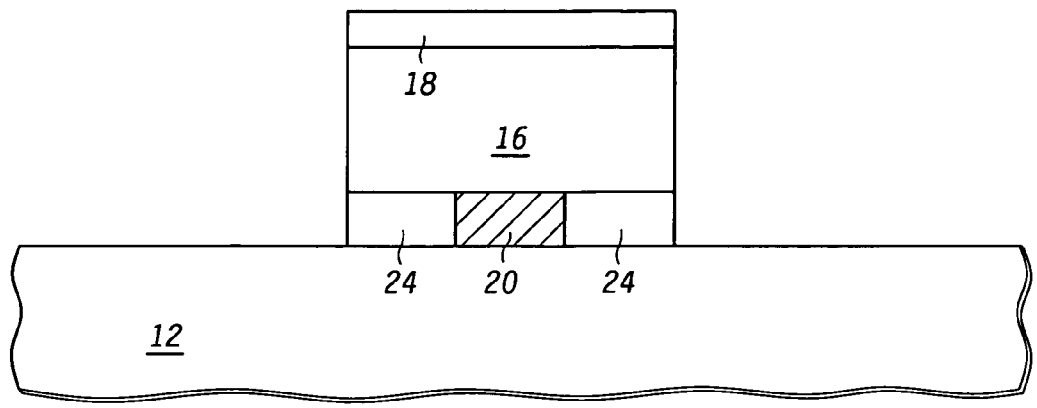
FIG. 4 illustrates the semiconductor device of FIG. 3 after patterning the nitride layer in accordance with an embodiment of the present invention.

As shown in FIG. 4, portions of the discrete charge storage material 22 that are not within the gaps 19 are removed leaving discrete charge storage regions 24 with the gaps 19. As previously discussed, the charge storage material 22 substantially fills the gaps 19 and need not completely fill the gaps 19.

Figure 5:
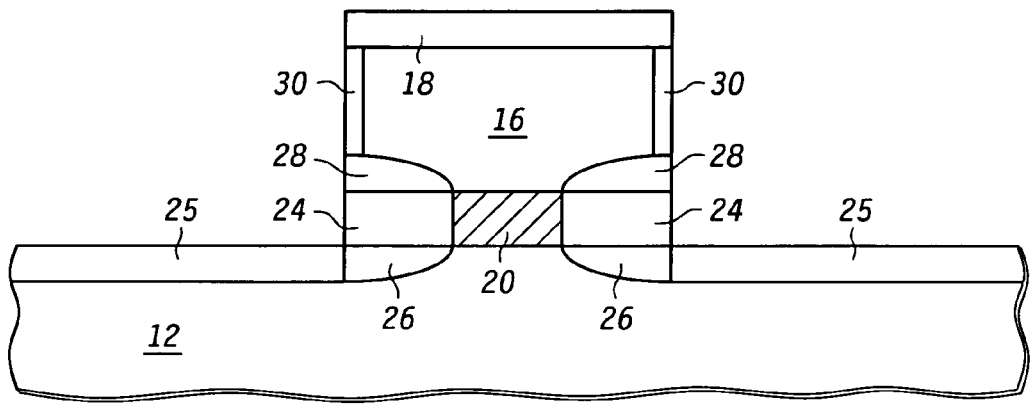
FIG. 5 illustrates the semiconductor device of FIG. 4 after forming an oxidation process in accordance with an embodiment of the present invention.

After forming the discrete charge storage regions 24, an oxidation process is performed to form the blocking regions 28, the tunneling regions 26, oxidized substrate regions 25, and isolation sidewalls 30, as shown in FIG. 5. In one embodiment, the oxidation process is a poly re-oxidation (poly reox) process. In one embodiment, the poly reox process is a dry oxidation at a temperature between approximately 800 to 1000 degrees Celsius and the amount of growth is between approximately 30 to 150 Angstroms. Any exposed surfaces of materials including an oxidizable element (e.g., silicon) will oxidize during the poly reox. In addition, the oxidation will encroach into the bulk materials. However, the amount of encroachment may depend on the speed of oxygen diffusion.

For example, because oxygen diffusion between a nitride and silicon interface is faster than within bulk silicon, the blocking regions 28 and the tunneling regions 26 encroach farther into the gate electrode 16 than the isolation sidewalls 30 (if the gate electrode 16 and the semiconductor substrate 12 include silicon and the discrete storage regions 24 include nitrogen.) Because diffusion of oxygen is faster within polysilicon than within monocrystalline silicon, if the gate electrode 16 is polysilicon and the semiconductor substrate 12 is monocrystalline silicon, the blocking regions 28 will have a greater volume than that of the tunneling regions 26. While the isolation sidewalls 30 and the oxidized substrate regions 25 are formed during the oxidation process because they are exposed to the oxidizing ambient, it is not necessary that they be formed and instead is a nonharmful byproduct of the process. The blocking regions 28 are the blocking dielectric for the non-volatile memory device being formed, and the tunneling regions 26 are the tunnel dielectrics for the non-volatile memory device. In one embodiment, the blocking regions 28 are blocking oxide regions and the tunneling regions 26 are tunneling oxide regions.

Figure 6:
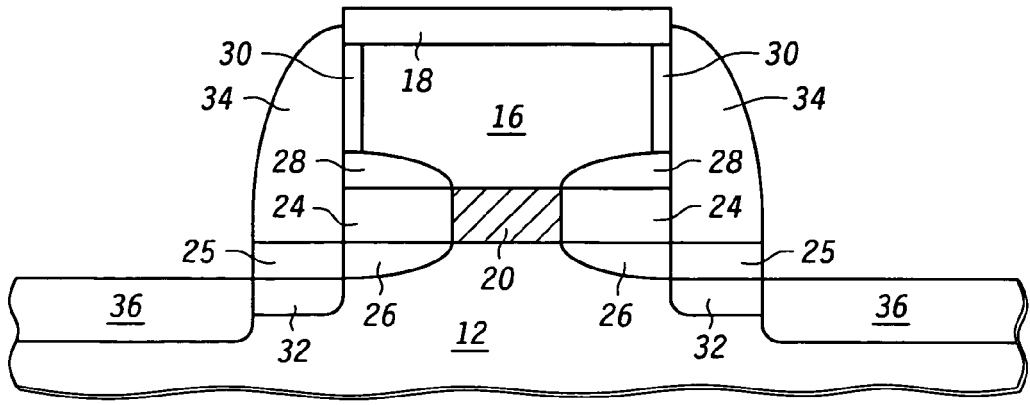
FIG. 6 illustrates the semiconductor device of FIG. 5 after forming source/drain extensions, spacers, and deep source/drain regions in accordance with an embodiment of the present invention.

As shown in FIG. 6, after forming the blocking regions 28, the tunneling regions 26, and the isolation sidewalls 30, source/drain extension regions 32, spacers 34, and deep source/drain regions 36 are formed. First, the source/drain extension regions 32 are formed using any conventional processing. Next the spacers 34 are formed using any conventional processing. The spacers 34 may include more than one material, such as silicon oxide and silicon nitride. The isolation sidewalls 30 in conjunction with the spacers 34 help to isolate the gate electrode 16. The deep source/drain regions 36 are formed after forming the spacers 34 and can be formed by any conventional processing. Next, portions of the oxidized substrate regions 25 that are exposed (i.e., not under the spacers 34) are removed using a dry etch, wet etch, or a combination of a dry and wet etch. However, due to the presence of the oxidized substrate region 25 that is removed next, source/drain extension regions 32 and the deep source/drain regions 36 are recessed with respect to the top of the semiconductor substrate 12. Subsequently, conventional processing can be used to form contacts, vias, interconnects, and other processes to form the remainder of a semiconductor device.

Figure 7:
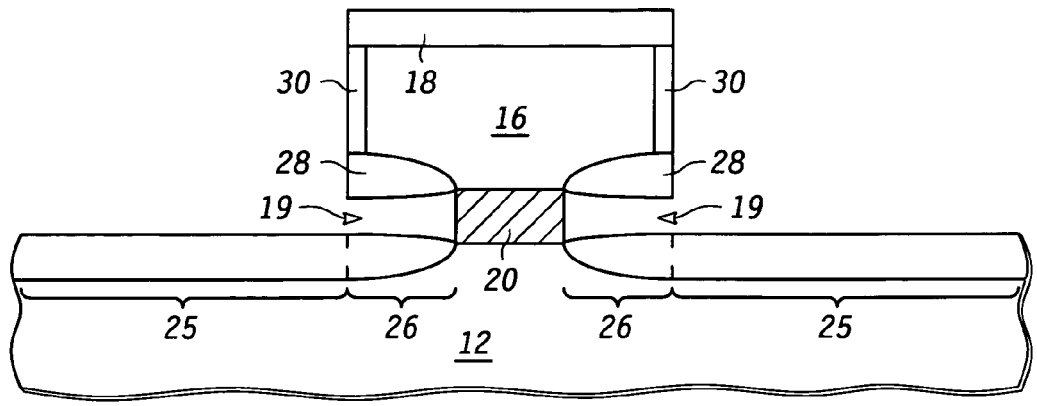
FIG. 7 illustrates the semiconductor device of FIG. 2 after forming an oxidation process in accordance with an embodiment of the present invention.

In the embodiments discussed above, the oxidation process was performed after forming the discrete charge storage regions 22. However, in the embodiments, the oxidation process is formed before forming the discrete charge storage regions 22. FIG. 7 shows the resulting structure after performing the oxidation process on the semiconductor device 10 of FIG. 2 to form isolation sidewalls 30, blocking regions 28, tunneling regions 26, and oxidized substrate regions 25. Any oxidization process previously discussed, such as a poly reox process, can be used. In FIG. 7, the semiconductor device 10 includes blocking region 26 and tunnel region 26 on either side of the isolation region 20. The gaps 19 separate a blocking region 26 from an underlying tunnel region 26. Because the oxidation process will encroach into the gaps 19, the gaps 19 in FIG. 7 are most likely smaller in volume than the gaps 19 in FIGS. 2-6.

Figure 8:
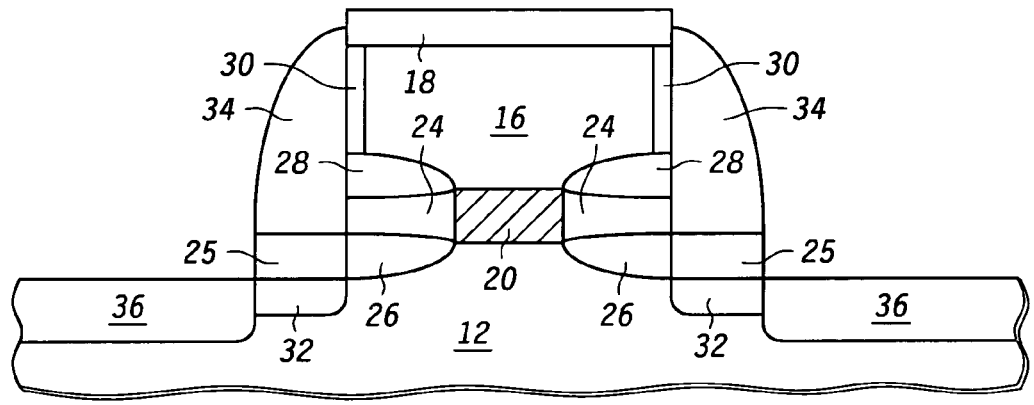
FIG. 8 illustrates the semiconductor device of FIG. 7 after forming source/drain extensions, spacers, and deep source/drain regions in accordance with an embodiment of the present invention.

As shown in FIG. 8, after performing the oxidation the discrete charge storage regions 24 are formed within the gaps 19 and then source/drain extension regions 32, spacers 34, and deep source/drain regions 36 are formed and the oxidized substrate regions 25 are removed. Any method previously discussing forming the discrete charge storage regions 24, the source/drain extension regions 32, the spacers 34, and the deep source/drain regions 36 can be used. The portions of the oxidized substrate regions 25 that are not under the spacers 34 are removed by etching, either dry, wet, or a combination of both. Subsequently, conventional processing can be used to form contacts, vias, interconnects, and other processes to form the remainder of a semiconductor device.

In the embodiments discussed above, only one discrete charge storage material (e.g., a nitride layer, a single or group of nanoclusters or alloys including metal and silicon) is formed within the gaps 19, but multiple nitride layers may be formed in the gaps 19. One embodiment of forming multiple discrete charge storage materials, either all of the same material or different materials is shown in FIGS. 9-13.

Figure 9:
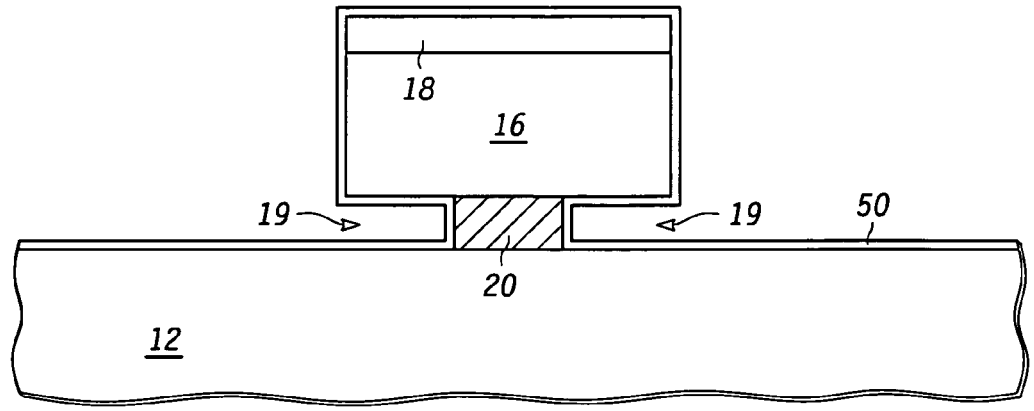
FIG. 9 illustrates the semiconductor device of FIG. 2 after forming a nitride layer in accordance with an embodiment of the present invention.

FIG. 9 shows the resulting structure after forming a first discrete charge storage material 50 over the semiconductor device 10 of FIG. 2. The first discrete charge storage material 50, which in the embodiment illustrated is a nitride (e.g., an LPCVD nitride), may be formed by any process previously described for forming the discrete charge storage material. In one embodiment, the first discrete charge storage material 50 is approximately 50 to 150 Angstroms thick. In the embodiment illustrated, after forming the first discrete charge storage material 50, the insulating layer 52 is formed by thermally oxidizing the first discrete charge storage material 50, which in this embodiment is a nitride. In one embodiment, the insulating layer 52 is approximately 50 Angstroms thick. In one embodiment, the thermal oxidation process is a steam process to increase the speed of the oxidization. By thermally growing the insulating layer 52 a higher quality interface is formed between the first discrete charge storage material 50 and the insulating layer 52 because a transitional layer between the two materials is formed. This higher quality interface improves device reliability. Next, any portions of the first discrete charge storage material 50 and the insulating layer 52 that are not within the gaps 19 are removed. The removal may be performed by a dry etch. In other embodiment, any portions of the first discrete charge storage material 50 that are not within the gap 19 may be removed prior to forming the insulating layer 52, which may be subsequently formed by any process, such as CVD, ALD, thermal oxidation, the like, or combinations of the above. Then, any portions of the insulating layer 52 that are not within the gaps 19 may be removed. Because oxidation of a nitride takes longer than that of monocrystalline silicon, if the first discrete charge storage material 50 is nitride and the semiconductor substrate 12 is silicon, it is desirable to thermally oxide the first discrete charge storage material 50 prior to removing portions of the first discrete charge storage material 50 that are not within the gaps 19 to prevent a large portion of the substrate 12 from being consumed.

Figure 10:
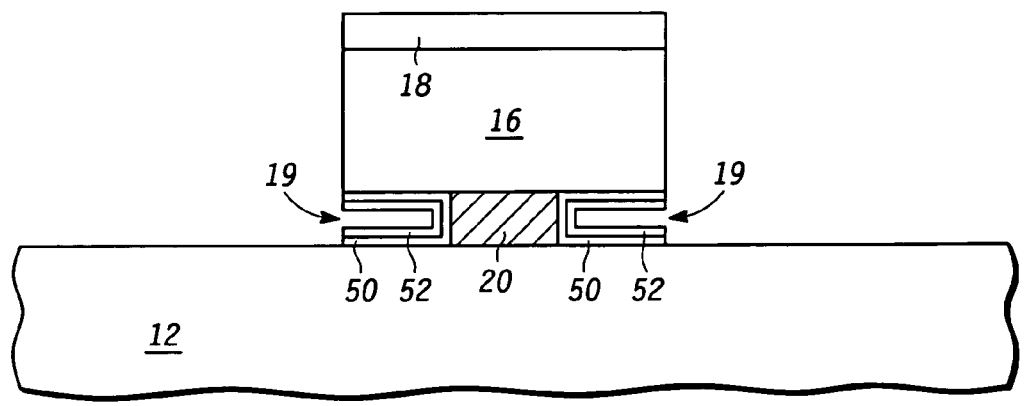
FIG. 10 illustrates the semiconductor device of FIG. 9 after forming a dielectric layer in accordance with an embodiment of the present invention.

Although not shown, the processes taught in FIGS. 9 and 10 can be repeated to form additional pairs of insulating layers and discrete charge storage materials in the gaps 19. All the insulating layers and all the discrete charge storage materials within the gap 19 need not be the same materials. Thus, in one embodiment, one discrete charge storage material can be a layer of nanoclusters and another material may be a nitride.

Figure 11:
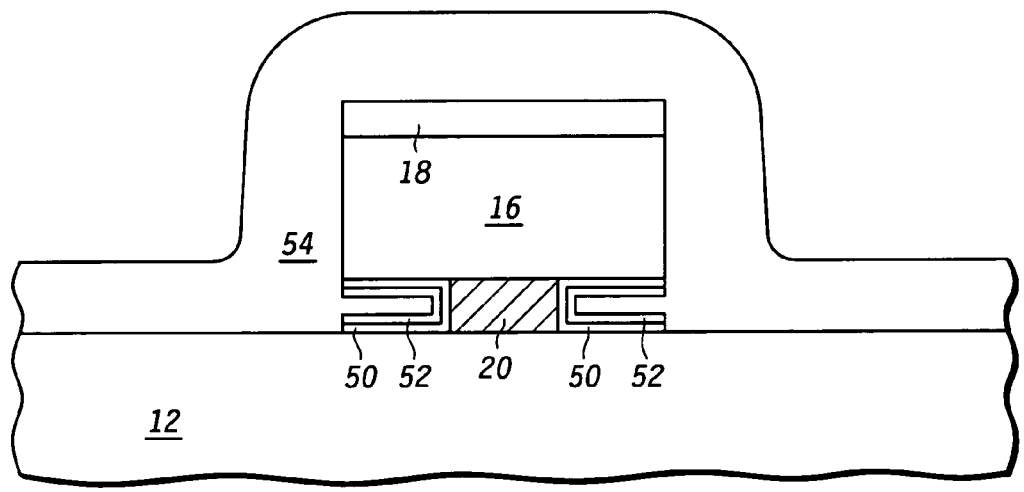
FIG. 11 illustrates the semiconductor device of FIG. 10 after forming another nitride layer over the semiconductor device of the present invention.
Figure 12:
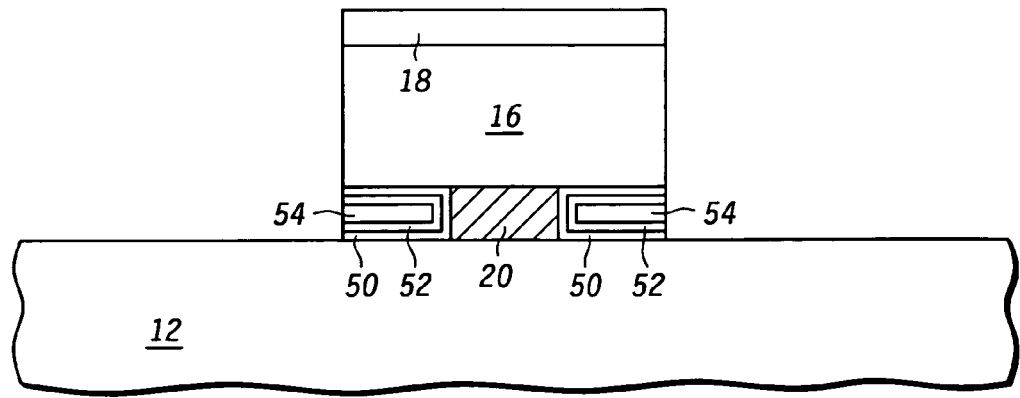
FIG. 12 illustrates the semiconductor device of FIG. 11 after etching the another nitride layer in accordance with an embodiment of the present invention.

As shown in FIG. 11, forming the desired number of pairs of the insulating layers and discrete charge storage materials a final (or second in the embodiment illustrated) discrete charge storage material 54 is formed over the semiconductor device 10. The second discrete charge storage material 54 may or may not be the same material as the first discrete charge storage material 50. In one embodiment, the second discrete charge storage material 54 is a nitride that has been deposited by, for example, CVD or ALD.

After forming the second discrete charge storage material 54 over the semiconductor device, portions of the second discrete charge storage material 54 that are outside the gap 19 are removed so that the charge storage material 54 remains within the gaps 19. In one embodiment, the removal is a dry etch.

Figure 13:
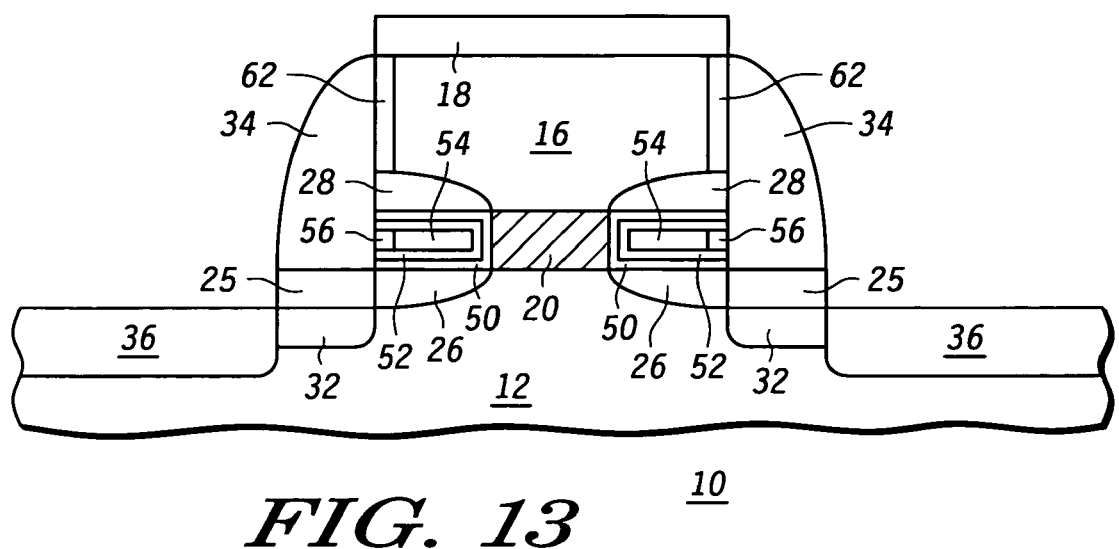
FIG. 13 illustrates the semiconductor device of FIG. 12 after further processing.

After forming the charge storage material 54 within the gaps 19, an oxidation process is performed and source/drain extension regions 32, spacers 34, and deep source/drain regions 36 are formed, as shown in FIG. 13. Any oxidization process previously discussed, such as a poly reox process, can be used. During the oxidation process blocking regions 28, tunneling regions 26, and oxidized substrate regions 25 are formed, as previously discussed and oxidized sidewalls 62 and 56 are also formed. The oxidized sidewalls 62 are equivalent to the oxidized sidewalls 30, which were previously discussed. The oxidized sidewalls 56 are formed along the sidewalls of the second discrete charge storage material 54 during the oxidation. Like the oxidized sidewalls 62, the oxidized sidewalls 56 are not needed but are a nonharmful byproduct of the oxidation. Next, source/drain extension regions 32 are formed, as previously discussed. Then the spacers 34 are formed, and the deep/source drain extensions 36 are formed. Then, the exposed portions of the oxidized substrate regions 25 are removed. Subsequent processing, as known to a skilled artisan, is then performed to complete the semiconductor device.

By now it should be appreciated that there has been provided methods for forming semiconductor devices that enable multibit storage as channel lengths decrease. By having insulating layers between discrete charge storage layers or other materials or air between the discrete charge storage layer and the insulating region 20, there is more material than just the insulating region 20 to screen the discrete charge storage layers and prevent or minimize the Frenkel-Poole mechanism. In some embodiments described above, the oxidation process is a poly reox process. This is advantageous because it does not add processing when using a gate electrode that includes polysilicon since this process is performed anyway.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term another, as used herein, is defined as at least a second or more. The term "coupled", as used herein, is defined as connected, although not necessarily directly, and not necessarily mechanically.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for forming a semiconductor device, the method comprising:
   providing a semiconductor substrate comprising silicon, wherein the semiconductor substrate has a surface;
   forming a layer of dielectric on the surface of the semiconductor substrate;
   forming a gate electrode comprising silicon over the layer of dielectric;
   recessing the layer of dielectric under the gate electrode to form a recess;
   filling the recess with a charge storage material;
   oxidizing a portion of the gate electrode, wherein the oxidizing the portion of the gate electrode occurs after the filling the recess with the charge storage material; and
   oxidizing a portion of the semiconductor substrate.

2. The method of claim 1, wherein the layer of dielectric comprises an oxide.

3. The method of claim 1, wherein the charge storage material comprises a nitride.

4. The method of claim 3, wherein the charge storage material comprises nanoclusters.

5. The method of claim 3, wherein the charge storage material comprises a metal and silicon.

6. The method of claim 1, wherein the oxidizing the portion of the gate electrode and the oxidizing the portion of the semiconductor substrate forms a SONOS structure.

7. The method of claim 1, wherein the oxidizing the portion of the gate electrode and the oxidizing the portion of the semiconductor substrate is done simultaneously.

8. The method of claim 7, wherein the oxidizing the portion of the gate electrode and the oxidizing the portion of the semiconductor substrate is done using a dry oxidation process.

9. The method of claim 7, wherein the oxidizing the portion of the gate electrode and the oxidizing the portion of the semiconductor substrate forms an oxide layer approximately 50-100 Å thick.

10. The method of claim 7, wherein the oxidizing the portion of the gate electrode forms a blocking oxide region and the oxidizing the portion of the semiconductor substrate forms a tunnel oxide region.

11. The method of claim 1, wherein the recess has a lateral dimension of between 0.01 µm and 0.2 µm.

12. The method of claim 1, further comprising:
    forming source and drain implant regions;
    forming sidewall spacers; and
    forming a remainder of the semiconductor device.

13. A method for forming a semiconductor device, the method comprising:
    providing a semiconductor substrate comprising silicon, wherein the semiconductor substrate has a surface;
    forming a first layer of a dielectric on the surface of the semiconductor substrate;
    forming a gate electrode comprising silicon over the first layer of the dielectric;
    recessing the first layer of the dielectric under the gate electrode to form a recess;
    forming a first layer of a discrete charge storage material which partially fills the recess of the first layer of the dielectric under the gate electrode;
    forming a second layer of the dielectric over at least the first layer of the discrete charge storage material, the second layer of the dielectric partially filling the recess of the first layer of the dielectric under the gate electrode;
    forming a second layer of the discrete charge storage material over the second layer of the dielectric, the second layer of the discrete charge storage material substantially filling the recess of the first layer of the dielectric under the gate electrode;
    oxidizing a portion of the gate electrode; and
    oxidizing a portion of the semiconductor substrate.

14. The method of claim 13, wherein the first layer of the dielectric comprises an oxide.

15. The method of claim 13, wherein the first layer of the discrete charge storage material and the second layer of the discrete charge storage material comprise a nitride.

16. The method of claim 13, wherein the first layer of the discrete charge storage material and the second layer of the discrete charge storage material comprise nanoclusters.

17. The method of claim 13, wherein the first layer of the discrete charge storage material and the second layer of the discrete charge storage material comprise a metal and silicon.

18. The method of claim 13, further comprising:
    forming source and drain implant regions;
    forming sidewall spacers; and
    forming a remainder of the semiconductor device.

19. A method for forming a semiconductor device, the method comprising:
    providing a semiconductor substrate comprising silicon, wherein the semiconductor substrate has a surface;
    forming a layer of dielectric on the surface of the semiconductor substrate;
    forming a gate electrode comprising silicon over the layer of dielectric;
    recessing the layer of dielectric under the gate electrode to form a recess;
    filling the recess with a discrete charge storage material;
    oxidizing a portion of the gate electrode;
    oxidizing a portion of the semiconductor substrate;
    forming source and drain implant regions;
    forming sidewall spacers; and
    forming a remainder of the semiconductor device.

20. The method of claim 19, wherein the oxidizing the portion of the gate electrode and the oxidizing the portion of the semiconductor substrate is done simultaneously.

* * * * *